United States Patent [19]

Uchida

[11] Patent Number: 5,715,203
[45] Date of Patent: Feb. 3, 1998

[54] SEMICONDUCTOR MEMORY DEVICE AND AUTOMATIC BIT LINE PRECHARGE METHOD THEREFOR

[75] Inventor: Toshiya Uchida, Kawasaki, Japan

[73] Assignee: Fujitsu Limited, Kanagawa, Japan

[21] Appl. No.: 617,073

[22] Filed: Mar. 18, 1996

[30] Foreign Application Priority Data

Aug. 18, 1995 [JP] Japan ................... 7-210259

[51] Int. Cl.$^6$ .................. G11C 7/00; G11C 8/00
[52] U.S. Cl. .............. 365/203; 365/230.03; 365/230.06
[58] Field of Search .................. 365/203, 230.03, 365/230.06, 233

[56] References Cited

U.S. PATENT DOCUMENTS

| | | | |
|---|---|---|---|
| 5,294,342 | 3/1994 | Casper et al. | 365/203 |
| 5,416,743 | 5/1995 | Allan et al. | 365/203 |
| 5,463,590 | 10/1995 | Watanabe | 365/203 |

FOREIGN PATENT DOCUMENTS 0 640 975A2  1/1995  European Pat. Off. .

Primary Examiner—David C. Nelms
Assistant Examiner—Trong Phan
Attorney, Agent, or Firm—Nikaido Marmelstein Murray & Oram LLP

[57] ABSTRACT

The present invention relates to a semiconductor memory device having a bit line precharge circuit which precharges bit lines forming a data transfer path coupled to cells. The memory device is further provided with a first control circuit which controls the bit line precharge circuit to precharge the bit lines in response to a bit line precharge request, and a second control circuit which recognizes a command input from outside and makes the bit line precharge request with respect to the first control circuit. The second control circuit accepts a selection of whether or not to request automatic precharge of the bit lines when making an entry to a burst mode even when a burst length is set to a full column, and makes the bit line precharge request with respect to the first control circuit so that the bit lines are precharged after the burst mode ends when an entry to the burst mode requests the automatic precharge.

15 Claims, 7 Drawing Sheets

SEMICONDUCTOR MEMORY DEVICE AND AUTOMATIC BIT LINE PRECHARGE METHOD THEREFOR

BACKGROUND OF THE INVENTION

The present invention generally relates to semiconductor memory devices and automatic bit line precharge methods therefor, and more particularly to a semiconductor memory device such as a dynamic random access memory (DRAM) and a synchronous DRAM (SDRAM) which carry out a data input/output operation in synchronism with an external clock, and to an automatic bit line precharge method applicable to such a semiconductor memory device.

Recently, the trend of improving the integration density and operation speed of DRAMs is shifting to the development of the SDRAMs, because the SDRAMs can be produced at approximately the same cost as the conventional DRAMs but a high-speed data transfer on the order of 100 MHz is possible in the SDRAMs.

However, the SDRAMs have many functions, and only a minimum number of required functions has been standardized by the Joint Electronic Device Engineering Council—Electronic Industrial Association. Therefore, each manufacturer provides additional functions in the SDRAMs in addition to the minimum number of required functions.

In the SDRAM, a sense amplifier is used as a SRAM cache, and a high-speed data transfer is possible if the data to be consecutively transferred exist within the same page. Hence, the SDRAM has an operation mode called a burst-mode which enables consecutive access to the data within the same page.

A number of bits that can be consecutively accessed in the burst mode is called a burst length. Normally, there are 5 kinds of burst lengths, namely, 1 bit, 2 bits, 4 bits, 8 bits and all bits of the page. The kind of burst length is programmable.

When the burst length is 2 bits or more, the user only needs to input the first bit of the address, and the address is automatically counted up within the SDRAM, thereby making it possible to make access to a programmed predetermined number of bits.

Suppose that the burst length is 2 bits, 4 bits or 8 bits. In this case, if a read command (RD) with no automatic precharge or a write command (WR) with no automatic precharge is input to the SDRAM when the SDRAM enters the burst mode, the SDRAM waits for a command in a state where the selected word line remains at the high level after a read operation or a write operation ends.

On the other hand, if a read command (RDA) with automatic precharge or a write command (WRA) with automatic precharge is input to the SDRAM when the SDRAM enters the burst mode, it is possible to automatically put the selected word line to a non-selected state after the read operation or the write operation ends and to start a bit line precharge operation.

FIG. 1 is a timing chart for explaining an example of an automatic precharge operation which utilizes an automatic precharge function. FIG. 1 shows a case where the burst length is 8 bits, and the number of cycles until the output data settles from the input of the read command, that is, the column address strobe (CAS) latency, is 2. In FIG. 1 and FIGS. 2 and 3 which will be described later, a portion with hatching indicates a don't care.

In FIG. 1, CLK denotes an external clock, /CS denotes a chip select signal, /RAS denotes a row address strobe (RAS) signal, /CAS denotes a CAS signal, /WE denotes a write enable signal, and A0 through A10 denote address signal bits, where the bar "/" indicates an inverted signal. In addition, WL denotes a potential of a word line WL, BL and /BL denote potentials of a pair of bit lines BL and /BL, CL denotes a column selection signal, DQ denotes input/output data, ACTV denotes a bank active command, and RDA denotes a read command with automatic precharge.

The address signal bit A10 is a code forming a command when inputting the read command or the write command, and the read command (RD) without automatic precharge or the write command (WR) without automatic precharge is recognized when the address signal bit A10 has a low level. On the other hand, the read command (RDA) with automatic precharge or the write command (WRA) with automatic precharge is recognized when the address signal bit A10 has a high level.

In this particular case shown in FIG. 1, the bank active command (ACTV) is input, and after a row address RA is read, the read command (RDA) with automatic precharge is input, and a column address CA is read.

As a result, the column selection signals CL which successively select the column addresses CA, CA+1, . . . . , CA+7 are successively output from a column decoder with respect to a column gate. In response to the column selection signals CL, data DQ, DQ+1, . . . , DQ+7 are successively output.

The selected word line WL is automatically put into a non-selected state in response to a falling edge of the column selection signal which selects the column address CA+7, thereby precharging the bit lines BL and /BL.

On the other hand, in the burst mode having the burst length amounting to all bits of 1 page, that is, a full column, there is internally no concept of "end" to the burst mode. For this reason, there is also no concept of "automatic precharge operation".

In other words, when the burst length is the full column, the operations of counting up of the address and making the access are repeated endlessly unless a burst stop command (BSTP) is input.

FIG. 2 is a timing chart for explaining an example of a burst end operation responsive to the burst stop command (BSTP). In FIG. 2, the same designations are used as in FIG. 1. As shown in FIG. 2, when the burst length is the full column and the burst stop command (BSTP) is input, the burst mode ends, and the SDRAM waits for a command in a state where the selected word line WL remains at the high level.

For example, in the case of a SDRAM having a memory capacity of 16 Mbits and an output bit construction of ×4, the column address is normally indicated by the address signal bits A0 through A9 and the length of 1 page is 1024 (1 k) bits. In this case, if a time of 10 ns (100 MHz) is required to make access to 1 bit, it requires a time of 10.24 μs to make access to all bits of 1 page.

On the other hand, it is required that a refresh interval is 16.5 μs at the maximum. Hence, it may be regarded rare that an access is made to all bits of 1 page and an access is thereafter made again to all bits of this 1 page in a state where the selected word line remains at the high level. It may be regarded normal that a precharging is made after making an access to all bits of 1 page.

However, in a case where the burst length is the full column, the automatic precharging operation does not exist, as described above. For this reason, in order to precharge the bit lines BL and /BL after the burst operation ends, it is necessary to input the burst stop command (BSTP) and thereafter input a precharge command (PRE) as shown in FIG. 3. FIG. 3 is a timing chart for explaining an example of a precharge operation which is carried out by inputting the precharge command (PRE) after inputting the burst stop command (BSTP). In FIG. 3, the same designations are used as in FIGS.1 and 2.

When inputting the burst stop command (BSTP) and thereafter inputting the precharge command (PRE), no data transfer can be made between a CPU and the SDRAM for 2 cycles which are required to input the burst stop comment (BSTP) and the precharge command (PRE). As a result, the need to input the burst stop comment (BSTP) and the precharge command (PRE) prevents the data transfer from being made at a high speed.

SUMMARY OF THE INVENTION

Accordingly, it is a general object of the present invention to provide a novel and useful semiconductor memory device and automatic bit line precharge method therefor, in which the problems described above are eliminated.

Another and more specific object of the present invention is to provide a semiconductor memory device and an automatic bit line precharge method which automatically carry out a precharge operation after a burst operation ends, even when the burst length is the full column, so that a data transfer efficiency between a CPU and the semiconductor memory device is improved.

Still another object of the present invention is to provide a semiconductor memory device having a bit line precharge circuit which precharges bit lines forming a data transfer path coupled to cells, and comprising a first control circuit which controls the bit line precharge circuit to precharge the bit lines in response to a bit line precharge request, and a second control circuit which recognizes a command input from outside and makes the bit line precharge request with respect to the first control circuit, where the second control circuit includes means for accepting a selection of whether or not to request automatic precharge of the bit lines when making an entry to a burst mode even when a burst length is set to a full column, and means for making the bit line precharge request with respect to the first control circuit so that the bit lines are precharged after the burst mode ends when an entry to the burst mode requests the automatic precharge. According to the semiconductor memory device of the present invention, it is possible to automatically precharge the bit lines without having to input a precharge command, even when the burst length is set to the full column. For this reason, it is possible to improve the data transfer efficiency between the semiconductor memory device and a CPU.

A further object of the present invention is to provide a semiconductor memory device having a bit line precharge circuit which precharges bit lines, comprising a control circuit, operatively connected to the bit line precharge circuit, recognizing a command input from outside, where the control circuit comprises means for accepting a selection of whether or not to request automatic precharge of the bit lines when making an entry to a burst mode and when a burst length is set to a full column, and means for making the bit line precharge request so that the bit lines are precharged after the burst mode ends when an entry to the burst mode requests the automatic precharge. According to the semiconductor memory device of the present invention, it is possible to automatically precharge the bit lines without having to input a precharge command, even when the burst length is set to the full column. For this reason, it is possible to improve the data transfer efficiency between the semiconductor memory device and a CPU.

Another object of the present invention is to provide an automatic bit line precharge method adapted to a semiconductor memory device having a bit line precharge circuit which precharges bit lines, comprising the steps of recognizing a command input from outside, accepting a selection of whether or not to request automatic precharge of the bit lines when making an entry to a burst mode and when a burst length is set to a full column, and making the bit line precharge request so that the bit lines are precharged after the burst mode ends when an entry to the burst mode requests the automatic precharge. According to the automatic bit line precharge method of the present invention, it is possible to automatically precharge the bit lines without having to input a precharge command, even when the burst length is set to the full column. For this reason, it is possible to improve the data transfer efficiency between the semiconductor memory device and a CPU.

Other objects and further features of the present invention will be apparent from the following detailed description when read in conjunction with the accompanying drawings.

DESCRIPTION OF THE PREFERRED EMBODIMENT

A description will be given of an embodiment of a semiconductor memory device according to the present invention, by referring to FIGS.4 through 6. In this embodiment, the present invention is applied to a SDRAM which has 2 banks A and B and a memory capacity of 16 Mbits.

Figure 4:
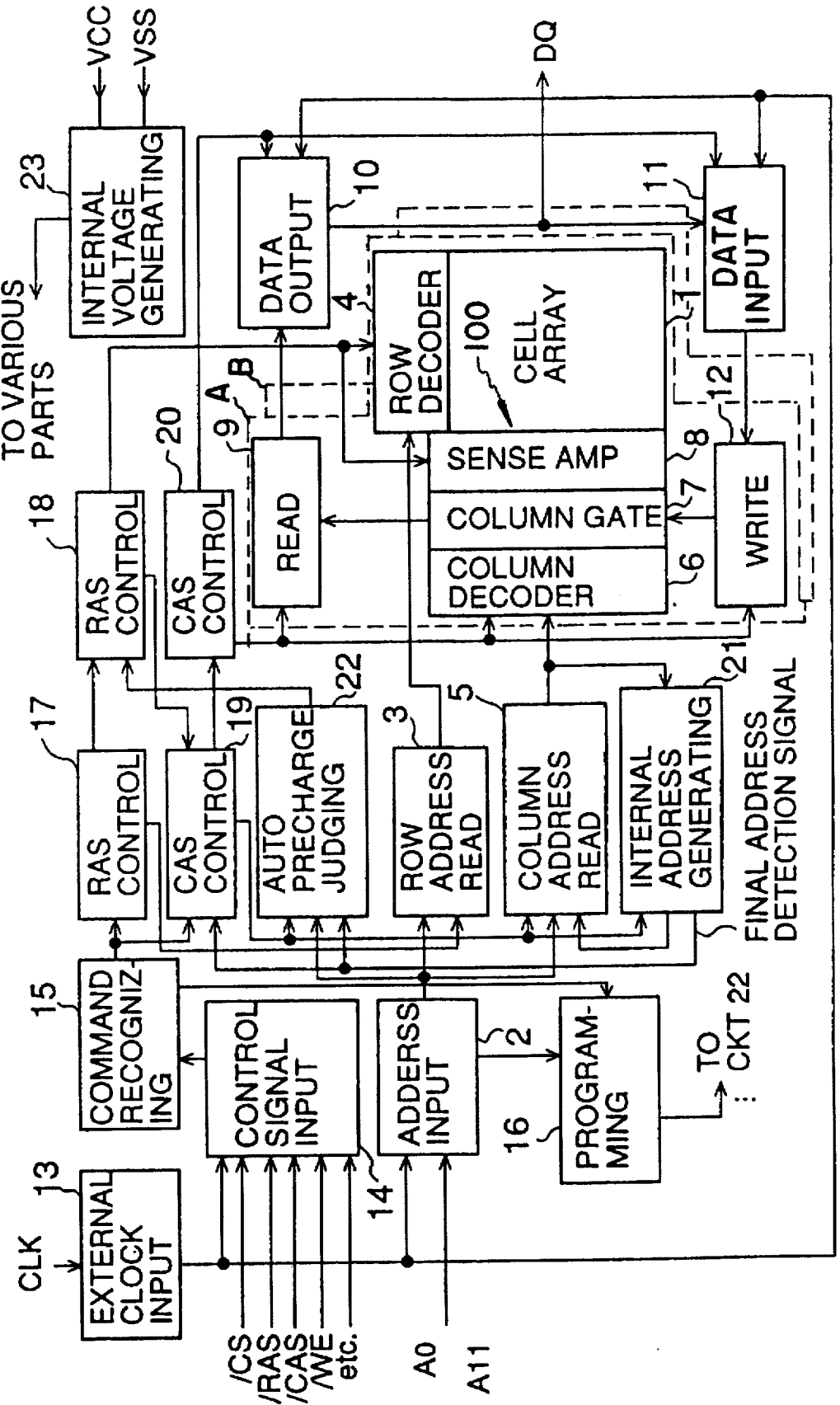
FIG. 4 is a system block diagram showing a part of an embodiment of a semiconductor memory device according to the present invention.

FIG. 4 is a system block diagram showing a part of this embodiment. In FIG. 4, cells are arranged in an array within a cell array 1, and address signal bits A0 through A11 are input to an address input circuit 2. The address signal bit A11 functions as a bank address signal for selecting a bank. The address signal bit A11 has a low level when selecting a bank A and a high level when selecting a bank B.

A row address reading circuit 3 reads a row address signal that is input to the address input circuit 2. A row decoder 4 decodes the row address signal read by the row address reading circuit 3, and selects a word line. A column address reading circuit 5 reads a column address signal input to the address input circuit 2. A column decoder 6 decodes the column address signal read by the column address reading circuit 5, and outputs a column selection signal which selects a column.

A column gate 7 selects a column based on the column selection signal output from the column decoder 6. A sense amplifier 8 amplifies data read from the cell array 1. A read circuit 9 reads the data output to a data bus via the column gate 7. A data output circuit 10 outputs the data read by the read circuit 9 to the outside.

A data input circuit 11 receives data to be written into the cell array 1. A write circuit 12 writes the data input to the data input circuit 11 to a specified cell within the cell array 1.

An external clock input circuit 13 receives an external clock CLK. A control signal input circuit 14 receives control signals such as a chip select signal /CS, a row address strobe (RAS) signal /RAS, a column address strobe (CAS) signal /CAS and a write enable signal /WE.

A command recognizing circuit 15 recognizes commands from the control signal input to the control signal input circuit 14. A programming circuit 16 programs the burst length, the CAS latency and the like.

A RAS control circuit 17 controls the row address read circuit 3 and the like. A RAS control circuit 18 controls the row decoder 4, the sense amplifier 8, a known bit line precharge circuit 100 which is coupled to the bit lines, and the like. When the RAS control circuit 18 receives a bit line precharge request from an automatic precharge judging circuit 22 which will be described later, the RAS control circuit 18 starts an operation to precharge the bit lines. In FIG. 4, it is assumed for the sake of convenience that the bit line precharge circuit 100 is provided within the block labelled "1" and indicating the cell array.

A CAS control circuit 19 controls the column address read circuit 5, the automatic precharge judging circuit 22 and an internal address generating circuit 21 which will be described later, and the like. A CAS control circuit 20 controls the column decoder 6, the read circuit 9, the data output circuit 10, the data input circuit 11, the write circuit 12 and the like.

When an entry is made to the burst mode and the burst length programmed in the programming circuit 16 is 2 bits or greater, the internal address generating circuit 21 makes a reference to a first bit of the column address output from the column address read circuit 5 and automatically generates the second and subsequent bits of the column address. In addition, when the burst length is 2 bits, 4 bits or 8 bits, the internal address generating circuit 21 counts the number of column addresses output from the column address read circuit 5, and outputs a final address detection signal with respect to the automatic precharge judging circuit 22 when the access to the programmed predetermined bit length ends.

When the burst length is 1 bit, the internal address generating circuit 21 outputs the final address detection signal with respect to the automatic precharge judging circuit 22 when the column address is output from the column address read circuit 5.

On the other hand, when the burst length is the full column, the internal address generating circuit 21 is controlled by the CAS control circuit 19 when a burst stop command (BSTP) is input and recognized by the command recognizing circuit 15, so that the internal address generating circuit 21 outputs the final address detection signal with respect to the automatic precharge judging circuit 22.

In FIG. 4, each block may have a known circuit construction, except for a portion of the automatic precharge judging circuit 22. In other words, the functions of each block shown in FIG. 4 may be realized by known means, except for a portion of the automatic precharge judging circuit 22.

Figure 5:
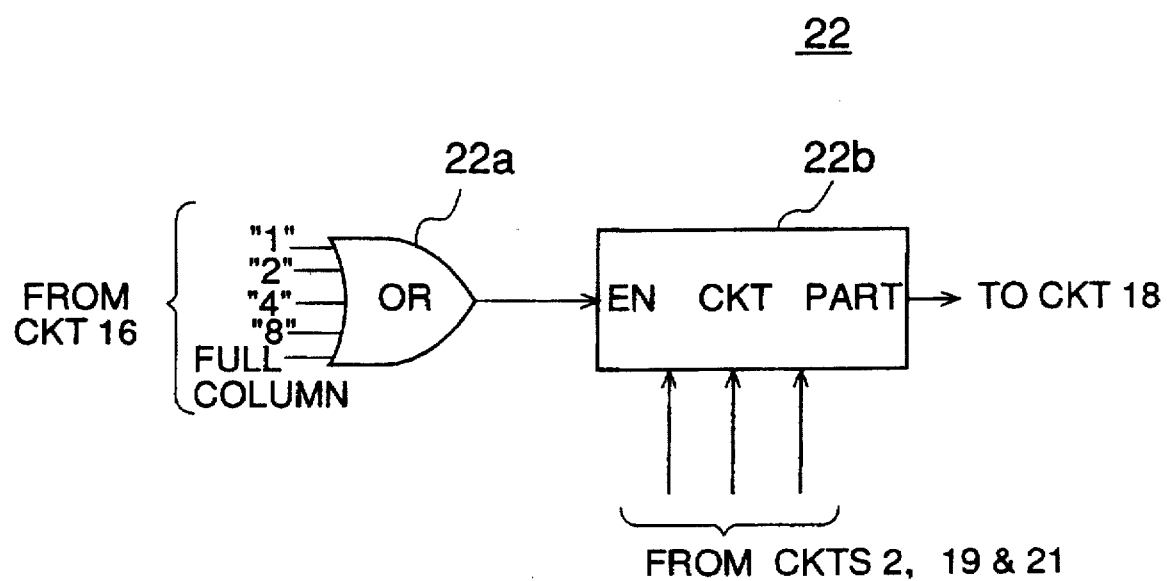
FIG. 5 is a system block diagram showing an embodiment of an automatic precharge judging circuit.

FIG. 5 is a system block diagram showing an embodiment of the automatic precharge judging circuit 22. The automatic precharge judging circuit 22 shown in FIG. 5 includes an OR circuit 22a, and a circuit part 22b which may have the same construction as a known automatic precharge judging circuit. Signals from the programming circuit 16 respectively indicating the burst lengths of 1 bit, 2 bits, 4 bits, 8 bits and the full column are input to the OR circuit 22a, and the circuit part 22b is enabled in response to an output signal of this OR circuit 22a. Hence, the automatic precharge judging circuit 22 is enabled when the burst length is programmed in the programming circuit 16.

The automatic precharge judging circuit 22 judges whether or not to carry out an automatic precharge when the burst mode ends. When an entry is made to the burst mode and the burst mode is recognized by the command recognizing circuit 15, the automatic precharge judging circuit 22 is controlled by the CAS control circuit 19 so as to read the address signal bit A10.

When the final address detection signal is received from the internal address generating circuit 21, the automatic precharge judging circuit 22 checks the content of the address signal bit A10 which is read upon entry to the burst mode. The automatic precharge judging circuit 22 issues a bit line precharge request with respect to the RAS control circuit 18 when the address signal bit A10 has a high level.

When a burst operation is carried out in one bank and the command recognizing circuit 15 recognizes that an entry is made to the burst mode with respect to the other bank, the automatic precharge judging circuit 22 is controlled by the CAS control circuit 19 and checks the content of the address signal bit A10 which is read upon entry to the burst mode of the one bank. The automatic precharge judging circuit 22 issues a bit line precharge request in the one bank with respect to the RAS control circuit 18 when the address signal bit A10 has a high level.

An internal voltage generating circuit 23 generates an internal power supply voltage by stepping-down a power supply voltage Vcc which is supplied from the outside. Vss denotes a ground voltage. Although the connections between the internal voltage generating circuit 23 and various parts of the SDRAM are not shown in FIG. 4, the internal power supply voltage is supplied to the various parts of the SDRAM.

Figure 1:
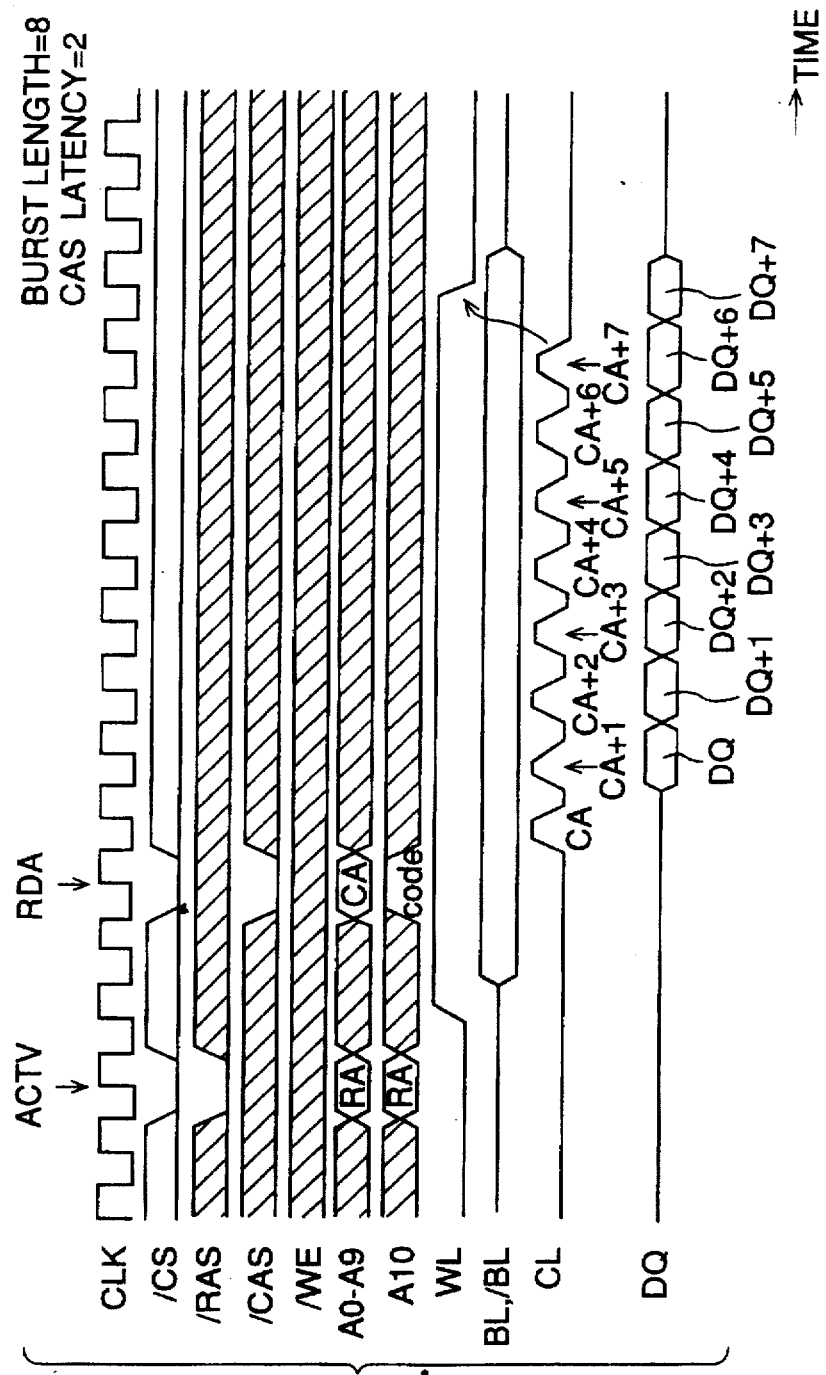
FIG. 1 is a timing chart for explaining an example of an automatic precharge operation which utilizes an automatic precharge function.
Figure 2:
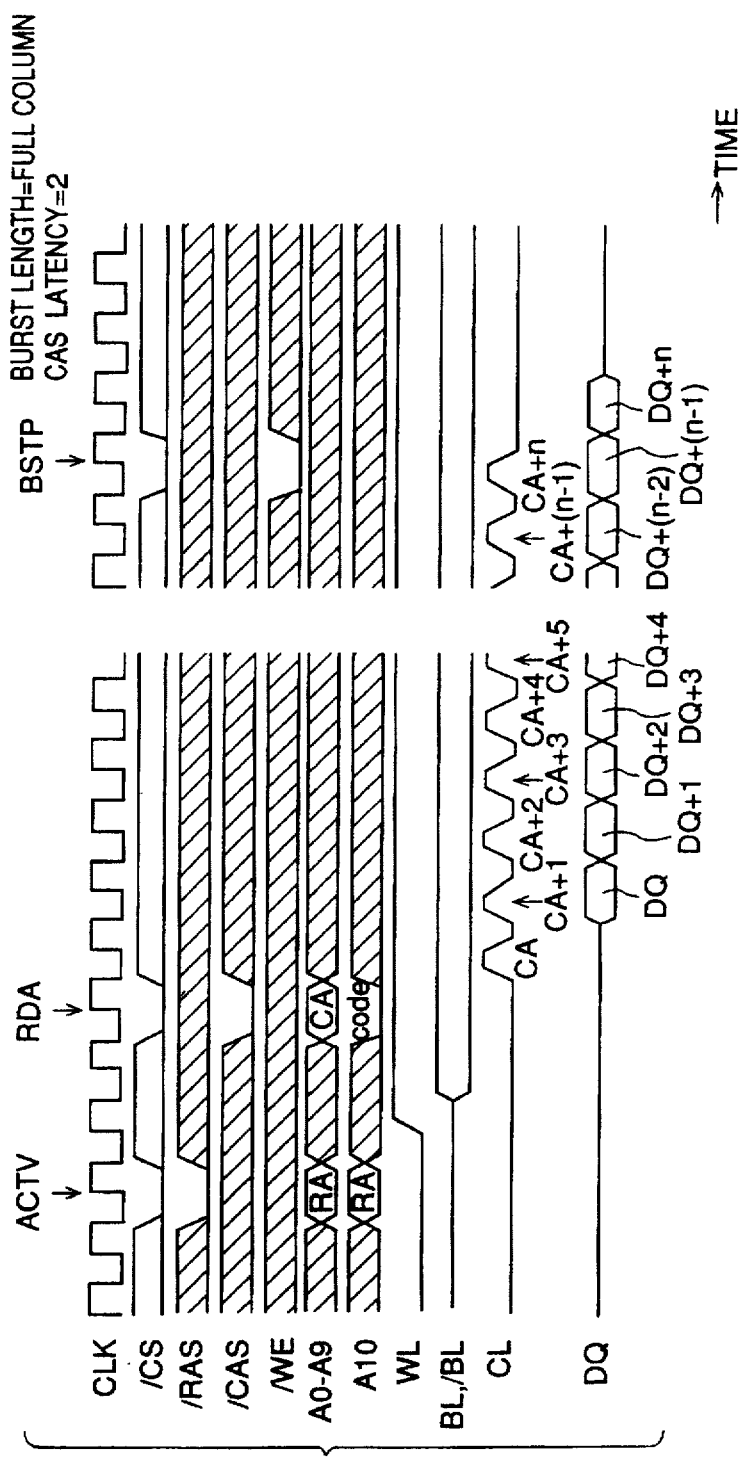
FIG. 2 is a timing chart for explaining an example of a burst end operation responsive to a burst stop command (BSTP)
Figure 3:
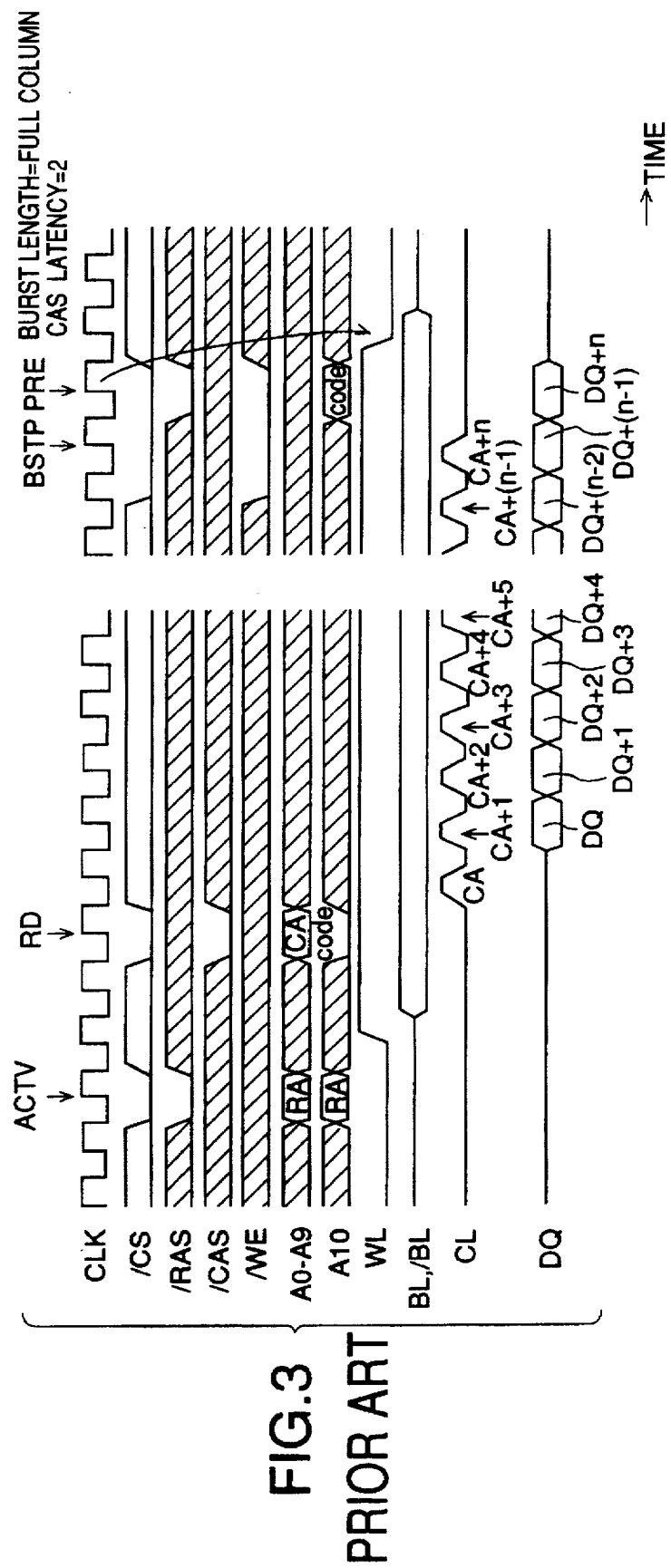
FIG. 3 is a timing chart for explaining an example of a precharge operation which is carried out by inputting a precharge command (PRE) after inputting the burst stop command (BSTP)
Figure 6:
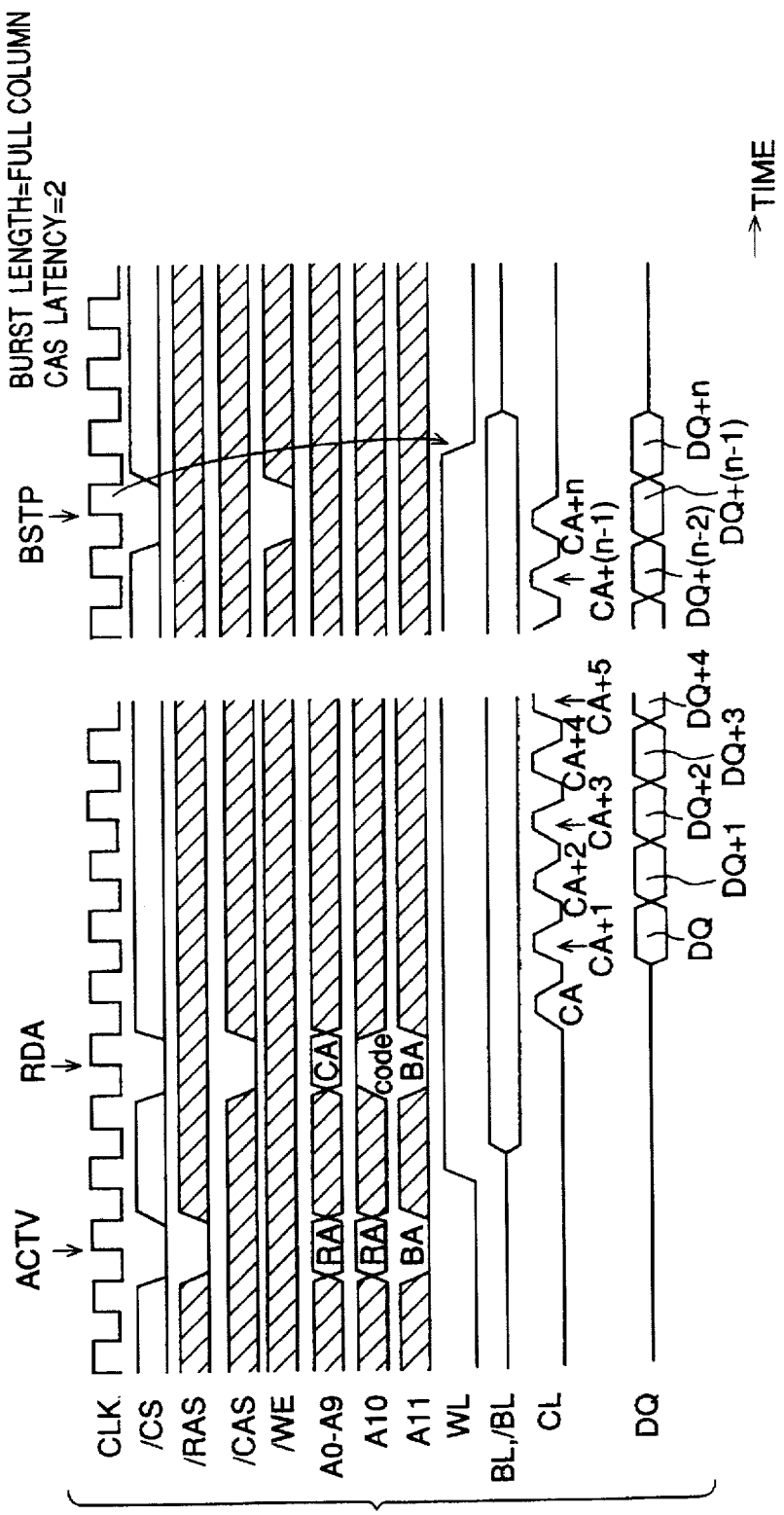
FIG. 6 is a timing chart for explaining an automatic precharge operation of the embodiment responsive to the burst stop command (BSTP)

FIG. 6 is a timing chart for explaining an automatic precharge operation of this embodiment responsive to the burst stop command (BSTP) for a case where the burst length is the full column. In FIG. 6, the same designations are used as in FIGS. 1 through 3.

In this case, the address signal bit A11 is set to a low level, a bank active command (ACTV) is input with respect to the bank A, and a read command is input thereafter, for example. When the command recognizing circuit 15 recognizes the input of the read command, the automatic precharge judging circuit 22 is controlled by the CAS control circuit 19 and reads the address signal bit A10 which indicates whether or not the read command is the read command (RDA) with automatic precharge.

In addition, the internal address generating circuit 21 in this case is controlled by the CAS control circuit 19 and starts to operate. More particularly, the internal address generating circuit 21 automatically and successively generates column addresses CA+1, CA+2, ... of the second and subsequent bits by making reference to the column address CA of the first bit output from the column address read circuit 5. The column addresses CA+1, CA+2, ... are supplied to the column address read circuit 5 which successively outputs data DQ, DQ+1, ... responsive thereto.

Thereafter, when the burst stop command (BSTP) is input and the command recognizing circuit 15 recognizes this burst stop command (BSTP), the internal address generating circuit 21 is controlled by the CAS control circuit 19 and generates the final address detection signal. This final address detection signal is supplied to the CAS control circuit 19 and the automatic precharge judging circuit 22.

When the final address detection signal is received from the internal address generating circuit 21, the automatic precharge judging circuit 22 checks the content of the address signal bit A10 which is read upon entry to the burst operation. In other words, when the entry made to the burst operation is the read command (RDA) with automatic precharge, the automatic precharge judging circuit 22 issues a precharge request with respect to the RAS control circuit 18.

The RAS control circuit 18 resets the row decoder 4 and the sense amplifier 8 and controls the bit line precharge circuit to precharge the bit lines BL and /BL. In addition, the RAS control circuit 18 controls the CAS control circuit 19 to an inactive state so as not to accept subsequent commands from the CAS system.

In this case, the input/output of the data DQ is stopped based on the final address detection signal via the CAS control circuits 19 and 20, independently of the automatic precharge.

When the internal address generating circuit 21 starts to operate and the programmed burst length is 2 bits, 4 bits or 8 bits, the internal address generating circuit 21 automatically generates the column addresses of the second and subsequent bits by making reference to the column address of the first bit output from the column address read circuit 5. The internal address generating circuit 21 supplies the automatically generated column addresses to the column address read circuit 5, and counts the bit length which is consecutively accessed. When the access to the programmed predetermined bit length ends, the internal address generating circuit 21 generates a final address detection signal and supplies this final address detection signal to the CAS control circuit 19 and the automatic precharge judging circuit 22.

On the other hand, when the internal address generating circuit 21 starts to operate and the programmed burst length is 1 bit, the internal address generating circuit 21 generates a final address detection signal when the column address is output from the column address read circuit 5, and supplies this final address detection signal to the CAS control circuit 19 and the automatic precharge judging circuit 22.

Further, when the burst length is 1 bit, 2 bits, 4 bits, 8 bits or the full column and the address signal bit A10 which is read upon entry to the burst mode has the low level, that is, when the entry made to the burst mode is the read command (RD) without automatic precharge, the automatic precharge judging circuit 22 does not issue a precharge request with respect to the RAS control circuit 18. Hence, in this case, the SDRAM waits for a next command in a state where the selected word line remains at the high level.

Figure 7:
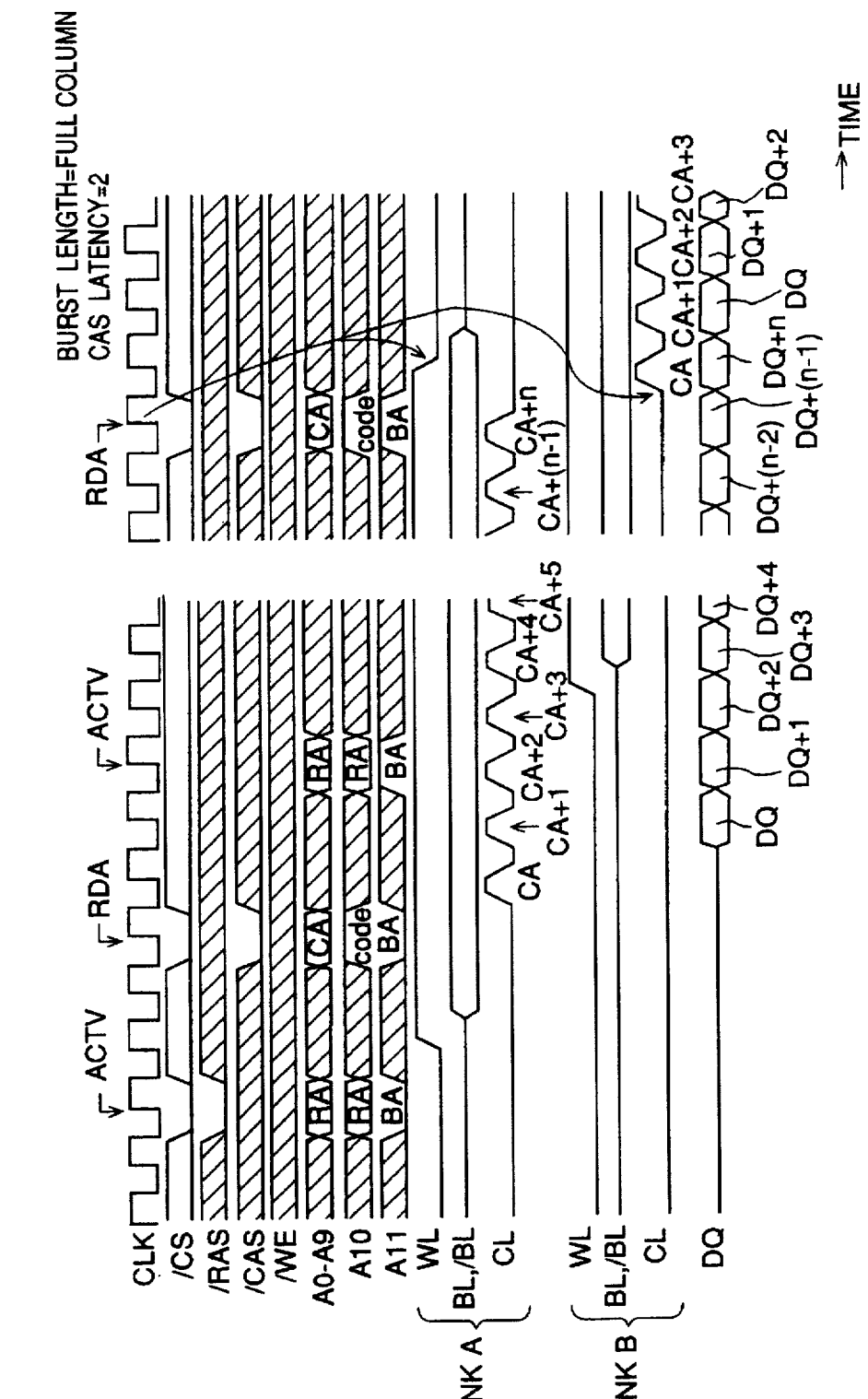
FIG. 7 is a timing chart for explaining the automatic precharge operation of the embodiment responsive to a read command (RDA) with automatic precharge, with respect to another bank.

FIG. 7 is a timing chart for explaining the automatic precharge operation of this embodiment responsive to a read command (RDA) with automatic precharge, with respect to another bank, for a case where the burst length is the full column. In FIG. 7, the same designations are used as in FIG. 6.

In this case, the address signal bit A11 set to a low level, a bank active command (ACTV) is input with respect to the bank A, and a read command is input thereafter, for example. When the command recognizing circuit 15 recognizes the input of the read command, the automatic precharge judging circuit 22 is controlled by the CAS control circuit 19 and reads the address signal bit A10 which indicates whether or not the read command is the read command (RDA) with automatic precharge.

In addition, the internal address generating circuit 21 in this case is controlled by the CAS control circuit 19 and starts to operate. More particularly, the internal address generating circuit 21 automatically and successively generates column addresses CA+1, CA+2, ... of the second and subsequent bits by making reference to the column address CA of the first bit output from the column address read circuit 5. The column addresses CA+1, CA+2, ... are supplied to the column address read circuit 5 which successively outputs data DQ, DQ+1, ... responsive thereto.

During the burst operation in this bank A, when the address signal bit A11 is set to a high level, the bank active command (ACTV) with respect to the bank B is input, the read command is input thereafter, and the command recognizing circuit 15 recognizes the input of the read command, the automatic precharge judging circuit 22 is controlled by the CAS control circuit 19 and checks the content of the address signal bit A10 which is read upon entry to the burst mode with respect to the bank A.

When the address signal bit A10 has the high level, that is, when the entry made to the burst mode with respect to the bank A is the read command (RDA) with automatic precharge, the automatic precharge judging circuit 22 issues a bit line precharge request with respect to the RAS control circuit 18. The RAS control circuit 18 resets the sense amplifier 8 and the row decoder 4 of the bank A in response to the bit line precharge request, and precharges the bit lines of the bank A.

In this case, the internal address generating circuit 21 is not controlled by the CAS control circuit 19 and does not generate a final address detection signal. Hence, no control is carried out with respect to the data input/output system. As a result, the SDRAM can accept input/output in this state, and the data output from the bank B is not prevented.

In this embodiment, the read command is input as the entry to the burst mode. However, it is of course possible to carry out the automatic precharge similarly when a write command is input instead.

According to this embodiment, even when the burst length is set to the full column, it is possible to automatically carry out the precharge after the burst mode by inputting the burst stop command (BSTP) when making an entry requesting the automatic precharge upon entry to the burst mode. For this reason, compared to the conventional case shown in FIG. 3, it is possible to effectively utilize 1 cycle of the operation cycles, thereby improving the data transfer efficiency between the SDRAM and the CPU.

When making entry to the burst mode with respect to one of the banks A and B, an entry requesting the automatic precharge may be made. In such a case, when the burst operation is carried out in one bank and an entry to the burst mode is made with respect to the other bank, this embodiment can automatically carry out the precharge with respect to the one bank after the burst mode ends. As a result, compared to the conventional case shown in FIG. 3, it is possible to effectively utilize 2 cycles of the operation cycles, thereby improving the data transfer efficiency between the SDRAM and the CPU.

Further, the present invention is not limited to these embodiments, but various variations and modifications may be made without departing from the scope of the present invention.

What is claimed is:

1. A semiconductor memory device having a bit line precharge circuit which precharges bit lines forming a data transfer path coupled to cells, said semiconductor memory device comprising:

a first control circuit which controls the bit line precharge circuit to precharge the bit lines in response to a bit line precharge request; and a second control circuit which recognizes a command input from outside and makes the bit line precharge request with respect to said first control circuit, said second control circuit comprising:

means for accepting a selection of whether or not to request automatic precharge of the bit lines when making an entry to a burst mode even when a burst length is set to a full column; and means for making the bit line precharge request with respect to said first control circuit so that the bit lines are precharged after the burst mode ends when an entry to the burst mode requests the automatic precharge.

2. The semiconductor memory device as claimed in claim 1, wherein said second control circuit further comprises:

an automatic precharge judging circuit which reads an input signal indicative of whether or not to request the automatic precharge of the bit lines when an entry to the burst mode is made even when the burst length is set to the full column, determines whether or not the input signal which requests the automatic precharge of the bit lines when the burst mode ends, and makes the bit line precharge request with respect to said first control circuit when the input signal which is read requests the automatic precharge of the bit lines.

3. The semiconductor memory device as claimed in claim 2, which further comprises:

an internal address generating circuit which automatically generates column addresses of predetermined bits during the burst mode; and a column decoder which outputs a column selection signal by decoding a column address, said second control circuit further comprising:

means for controlling said internal address generating circuit in response to a burst stop command which indicates an end of the burst mode to output a final address detection signal with respect to said automatic precharge judging circuit when a final column address is supplied to said column decoder when the burst length is a finite length of 2 bits or more, said automatic precharge judging circuit determining whether or not the input signal which is read requests the automatic precharge of the bit lines in response to the final address detection signal.

4. The semiconductor memory device as claimed in claim 2, wherein the cells form at least a first bank and a second bank, and said automatic precharge judging circuit determines whether or not the input signal which is read requests the automatic precharge of the bit lines when an entry to the burst mode is made with respect to the first bank in a state where a burst operation is being carried out in the second bank.

5. The semiconductor memory device as claimed in claim 3, wherein the cells form at least a first bank and a second bank, and said automatic precharge judging circuit determines whether or not the input signal which is read requests the automatic precharge of the bit lines when an entry to the burst mode is made with respect to the first bank in a state where a burst operation is being carried out in the second bank.

6. The semiconductor memory device as claimed in claim 1, which further comprises:

means for making a data input/output operation with respect to the cells in synchronism with an external clock.

7. A semiconductor memory device having a bit line precharge circuit which precharges bit lines, said semiconductor memory device comprising:

a control circuit, operatively connected to the bit line precharge circuit, recognizing a command input from outside, said control circuit comprising:

means for accepting a selection of whether or not to request automatic precharge of the bit lines when making an entry to a burst mode and when a burst length is set to a full column; and means for making the bit line precharge request so that the bit lines are precharged after the burst mode ends when an entry to the burst mode requests the automatic precharge.

8. The semiconductor memory device as claimed in claim 7, wherein said control circuit further comprises:

an automatic precharge judging circuit which reads an input signal indicative of whether or not to request the automatic precharge of the bit lines when an entry to the burst mode is made even when the burst length is set to the full column, determines whether or not the input signal requests the automatic precharge of the bit lines when the burst mode ends, and makes the bit line precharge request when the input signal requests the automatic precharge of the bit lines.

9. The semiconductor memory device as claimed in claim 8, which further comprises:

an internal address generating circuit which automatically generates column addresses of second and subsequent bits during the burst mode; and a column decoder which outputs a column selection signal by decoding a column address, said control circuit further comprising:

means for controlling said internal address generating circuit in response to a burst stop command which indicates an end of the burst mode to output a final address detection signal with respect to said automatic precharge judging circuit when a final column address is supplied to said column decoder when the burst length is a finite length of 2 bits or more, said automatic precharge judging circuit determining whether or not the input signal requests the automatic precharge of the bit lines in response to the final address detection signal.

10. The semiconductor memory device as claimed in claim 8, wherein the cells form at least a first bank and a second bank, and said automatic precharge judging circuit determines whether or not the input signal requests the automatic precharge of the bit lines when an entry to the burst mode is made with respect to the first bank in a state where a burst operation is being carried out in the second bank.

11. The semiconductor memory device as claimed in claim 9, wherein the cells form at least a first bank and a second bank, and said automatic precharge judging circuit determines whether or not the input signal requests the automatic precharge of the bit lines when an entry to the burst mode is made with respect to the first bank in a state where a burst operation is being carried out in the second bank.

12. The semiconductor memory device as claimed in claim 7, which further comprises:

means for making a data input/output operation with respect to the cells in synchronism with an external clock.

13. An automatic bit line precharge method for carrying out an automatic bit line in a semiconductor memory device having a bit line precharge circuit which precharges bit lines, said automatic bit line precharge method comprising the steps of:

recognizing a command input from outside;

accepting a selection of whether or not to request automatic precharge of the bit lines when making an entry to a burst mode and when a burst length is set to a full column; and making the bit line precharge request so that the bit lines are precharged after the burst mode ends when an entry to the burst mode requests the automatic precharge.

14. The automatic bit line precharge method as claimed in claim 13, which further comprises the steps of:

reading an input signal indicative of whether or not to request the automatic precharge of the bit lines when an entry to the burst mode is made even when the burst length is set to the full column;

judging whether or not the read input signal requests the automatic precharge of the bit lines when the burst mode ends; and making the bit line precharge request when the read input signal requests the automatic precharge of the bit lines.

15. The automatic bit line precharge method as claimed in claim 13, which further comprises the steps of:

making a data input/output operation with respect to the cells in synchronism with an external clock.

* * * * *